US006019609A

United States Patent [19]
Strange

[11] Patent Number: 6,019,609
[45] Date of Patent: Feb. 1, 2000

[54] ELASTOMERIC SHIELDED CONNECTOR

[75] Inventor: Andrew Strange, N. Attleboro, Mass.

[73] Assignee: Thomas & Betts International, Inc., Sparks, Nev.

[21] Appl. No.: 09/079,800

[22] Filed: May 15, 1998

[51] Int. Cl.[7] ..................... H01R 9/09
[52] U.S. Cl. ..................... 439/66; 439/74
[58] Field of Search ..................... 439/66, 91, 74, 439/86, 591

[56] References Cited

U.S. PATENT DOCUMENTS

| | | | |
|---|---|---|---|
| 4,157,932 | 6/1979 | Hirata | 156/310 |
| 4,288,081 | 9/1981 | Sado | 277/1 |
| 4,731,282 | 3/1988 | Tsukagoshi et al. | 428/220 |
| 4,752,231 | 6/1988 | Olson | 439/66 |
| 4,963,425 | 10/1990 | Buchanan et al. | 428/212 |
| 5,013,248 | 5/1991 | Brown et al. | 439/66 |
| 5,340,318 | 8/1994 | Kunihiro | 439/66 |
| 5,527,591 | 6/1996 | Crotzer et al. | 428/209 |
| 5,536,568 | 7/1996 | Teruo | 428/327 |
| 5,599,193 | 2/1997 | Crotzer | 439/66 |
| 5,670,251 | 9/1997 | Difrancesco | 428/325 |

*Primary Examiner*—Steven L. Stephan
*Assistant Examiner*—J. F. Duverne
*Attorney, Agent, or Firm*—Weingarten, Schurgin, Gagnebin & Hayes LLP

[57] ABSTRACT

An elastomeric connector provides shielded electrical connection between first and second circuit boards or other surfaces. Each circuit board includes an array of parallel conductive signal traces and an interposed array of parallel conductive ground traces. The elastomeric connector is comprised of an elongated generally rectangular body having an inner layer of conductive elastomeric material for providing selective electrical conduction between a first face and an opposite second face of the body. Electrically insulating elastomeric layers are provided on each side of the center conductive layer and elastomeric ground planes are provided on the respective opposite surfaces of the body orthogonal to the contact surfaces of the body. To provide shielded connection between the circuit boards, the elastomeric body is disposed between the confronting circuit boards in a direction generally perpendicular to the signal and ground traces, and with the conductive inner layer of the structure in electrical contact with the signal traces of the first and second circuit boards, and with the ground planes of the elastomeric structure in an electrical contact with the ground traces of the circuit boards. An electrically insulating coating is provided over portions of the signal traces which underlie one or both of the elastomeric ground planes to prevent shorting of the signal traces by the ground plane. The circuit boards and the interposed elastomeric structure are maintained in the engaged position by an appropriate alignment and locking mechanism.

8 Claims, 2 Drawing Sheets

42 38 34 36 40 12 16

16 24 16 18 14 20

ELASTOMERIC SHIELDED CONNECTOR

CROSS REFERENCE TO RELATED APPLICATIONS

None.

STATEMENT REGARDING FEDERALLY SPONSORED RESEARCH OR DEVELOPMENT

None.

BACKGROUND OF THE INVENTION

This invention relates to electrical connectors and more particularly to shielded electrical connectors.

Electrical circuits can be subject to electromagnetic interference by reason of electrical fields generated by external sources and by the circuit boards themselves or the circuitry in which the boards are a part. The problem of such interference becomes more acute at higher frequencies. In computer circuitry for example, the trend is for such circuits to operate at increasingly greater frequencies in order to increase speed of computer operations, and at these ever higher frequencies, electromagnetic interference can become a problem for the circuitry itself and to other equipment in the proximity of the circuitry. Shielded connectors are known for minimizing electromagnetic interference. One well known form of shielded connector is the coaxial connector having a center signal conductor and a surrounding ground or shield conductor which minimizes the external emission of electromagnetic radiation. Multipin computer connectors are also known in which shielding is provided by a surrounding metal shell. These known connectors provide sufficient electrical shielding but at a cost of relative complexity of construction and of relatively higher cost.

It would be beneficial to provide a shielded electrical connector which is relatively simple and low cost to manufacture and which can be readily installed for use with associated circuit boards.

BRIEF SUMMARY OF THE INVENTION

An elastomeric connector provides shielded electrical connection between first and second circuit boards or other surfaces. Each circuit board includes an array of parallel conductive signal traces and an interposed array of parallel conductive ground traces. The elastomeric connector is comprised of an elongated generally rectangular body having an inner layer of conductive elastomeric material for providing selective electrical conduction between a first face and an opposite second face of the body. Electrically insulating elastomeric layers are provided on each side of the center conductive layer and elastomeric ground planes are provided on the respective opposite surfaces of the body orthogonal to the contact surfaces of the body. To provide shielded connection between the circuit boards, the elastomeric structure is disposed between the confronting circuit boards in a direction generally perpendicular to the signal and ground traces, and with the conductive inner layer of the structure in electrical contact with the signal traces of the first and second circuit boards, and with the ground planes of the elastomeric structure in an electrical contact with the ground traces of the circuit boards. An electrically insulating coating is provided over portions of the signal traces which underlie one or both of the elastomeric ground planes to prevent shorting of the signal traces by the ground plane. The circuit boards and the interposed elastomeric structure are maintained in the engaged position by an appropriate alignment and locking mechanism.

In accordance with the invention the circuit board footprint of signal traces and adjacent ground traces in association with the shielded elastomeric connector structure provides shielded electrical connection between the circuit boards in a simple manner. The novel connector can achieve high speed interconnection of circuit boards or other conductive elements on respective spaced surfaces.

BRIEF DESCRIPTION OF THE SEVERAL VIEWS OF THE DRAWING

The invention will be more fully understood from the following detailed description taken in conjunction with the accompanying drawings in which.

DETAILED DESCRIPTION OF THE INVENTION

Figure 1:
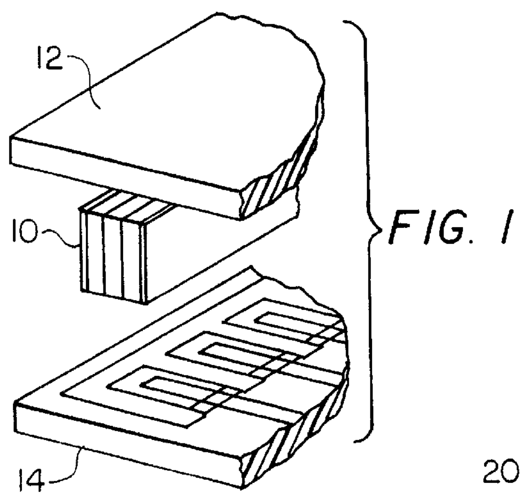
FIG. 1 is an exploded pictorial view of the elastomeric shielded connector and associated circuit boards in accordance with the invention.
Figure 2:
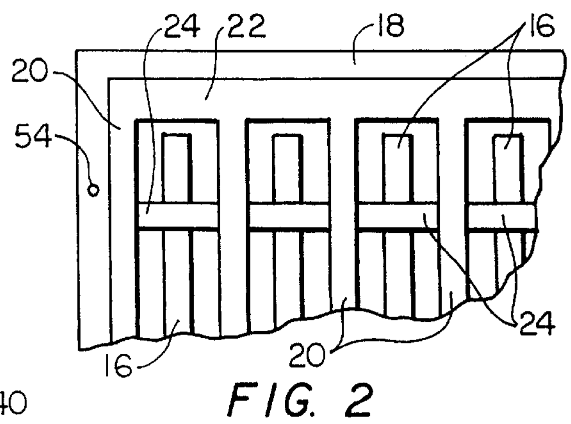
FIG. 2 is a plan view illustrating the signal and ground traces of a circuit board in accordance with the invention.

Referring to FIG. 1 there is shown in exploded view an elastomeric connector body 10 disposed between first and second circuit boards 12 and 14 and operative to interconnect signal traces and ground traces of the confronting surfaces of the respective circuit boards. The pattern of signal and ground traces which are present on each circuit board 12 and 14 are as illustrated in FIG. 2. A plurality of signal traces 16 are provided in a parallel spaced array on a surface 18 of the circuit board. A plurality of ground traces 20 are provided as illustrated with each ground trace interposed between adjacent signal traces 16. The ground traces in the illustrated embodiment are connected to a common ground path 22 disposed along one edge of the circuit board surface 18. Fabrication of the circuit board traces is accomplished by well known printed circuit board techniques. The circuit traces are connected in any intended manner to requisite portions of the circuit board which typically would be populated with integrated circuits and/or other electronic components. An electrically insulating material 24 is provided over portions of the signal traces. This material can be applied as a coating such as a solder mask or as a thin sheet material. The footprint of signal and ground traces on the confronting surfaces of the circuit boards 12 and 14 are mirror images of each other, and corresponding signal traces are electrically interconnected by the interposed resilient connector body as will be described.

Figure 3:
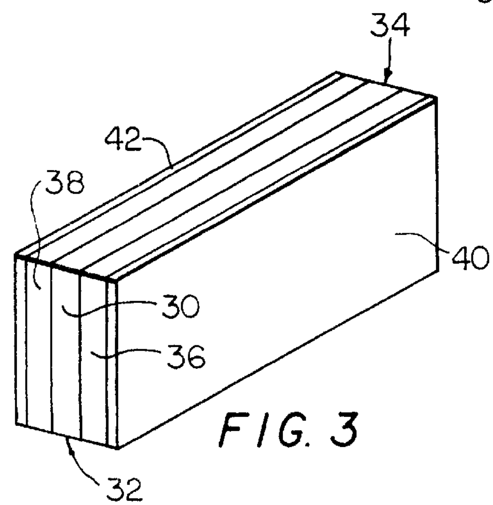
FIG. 3 is a pictorial view of the conductive elastomeric body in accordance with the invention.

The elastomeric connector body is illustrated in enlarged form in FIG. 3. The body has a multi-layer structure in which the inner layer 30 is of a conductive elastomeric material for providing electrical conduction between the bottom face 32 and top face 34 of the body. Layers 36 and 38 of electrically insulating elastomeric material are provided on respective sides of conductive elastomeric layer 30, and elastomeric ground planes 40 and 42 are provided on the respective outer surfaces of insulating layers 36 and 38. The layers 36 and 38 are typically bonded to the respective surfaces of conductive layer 30, and the conductive ground planes 40 and 42 are typically bonded to the respective surfaces of layers 36 and 38. The bonding can be accomplished by heat or by adhesive.

Figure 4:
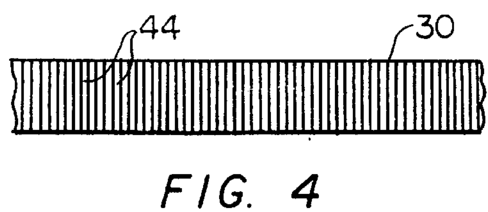
FIG. 4 is an exaggerated top view illustrating the conductive inner layer of the body of FIG. 3.

The conductive layer 30 is shown in exaggerated form in FIG. 4 and comprises parallel conductive strips or elements 44 which are arranged in side by side manner along the length of the layer. Each of the elements 44 includes conductive members or particles which provide an electrically conductive path between the top and bottom surfaces of the element. Alternatively, the elements 44 can be separated by nonconductive strips or coatings. There is no electrically conductive path from element to element. The conductive elastomer can be as shown in U.S. Pat. No. 5,340,318. Other types of conductive elastomers can alternatively be employed to provide an electrically conductive path between respective opposite faces of the elastomeric body.

Figure 5:
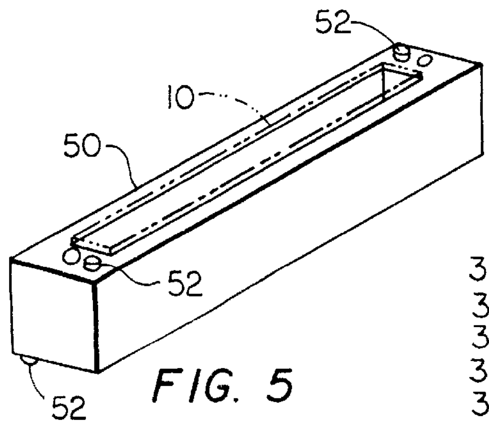
FIG. 5 is a pictorial view of a mounting assembly for use with the body of FIG. 3.

The elastomeric body is engaged with the circuit boards by a mounting assembly operative to maintain the body in electrical connection with the contacts of the circuit boards. As shown in FIG. 5, a frame 50 typically fabricated of rigid plastic or other electrically insulating material, having an opening or recess 52 therein sized to receive the elastomeric body with the conductive surfaces exposed for mating with the associated circuit boards. The frame 50 includes alignment posts 52 or other alignment and location elements which are cooperative with alignment holes 54 on the associated circuit boards to appropriately position the elastomeric body in registration with the circuit board traces to provide electrical connection of the signal traces on the respective circuit boards and to provide electrical grounding of the ground traces of the circuit boards and ground planes of the resilient body.

Figure 8:
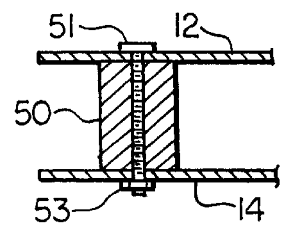
FIG. 8 is a sectional elevation view of the elastomeric shielded connector retained between the associated circuit boards.

The circuit boards are retained in connected position by appropriate fasteners such as machine screws 51 and nuts 53 as illustrated in FIG. 8. Other appropriate retention elements or structure can be employed to suit intended application requirements, as can the mounting assembly.

Figure 7:
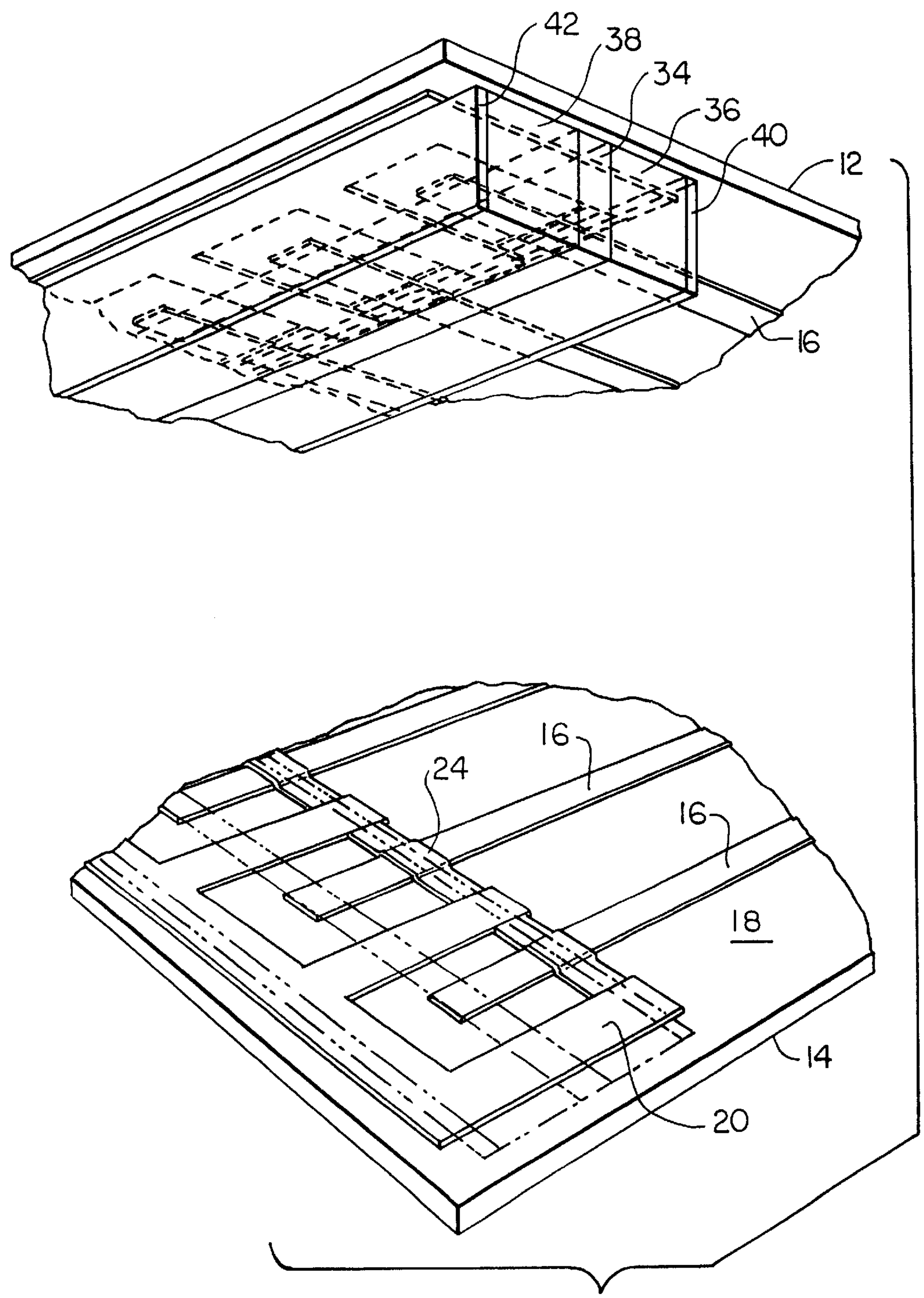
FIG. 7 is a further exploded pictorial view of the elastomeric shielded connector and associated circuit boards.

As illustrated in FIG. 7, the ground plane 42 is in electrical and mechanical contact with the conductive path 22 of respective circuit boards. The ground plane 40 is in engagement with one or more of the ground traces 20. Shorting of the underlying signal traces 16 by the ground plane 40 is prevented by the interposed insulating material 24. The signal traces of the respective circuit boards are interconnected by way of the conductive elastomeric layer 30. Thus the signal traces 16*a* of the spaced circuit boards are interconnected by the mated portion of layer 30, signal traces 16*b* of the spaced circuit boards are interconnected by the mating portions of layer 30, and in similar fashion all of the aligned signal traces of the respective circuit boards are electrically connected by the conductive elastomeric layer 30 of the connector body.

Figure 6:
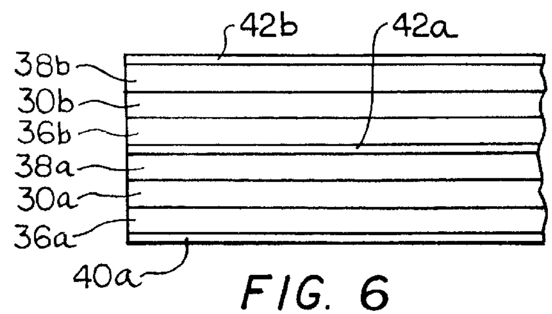
FIG. 6 is a top view of another embodiment of the invention employing multiple elastomeric connectors.

Another embodiment is shown in FIG. 6 in which multiple elastomeric connectors are coupled or ganged together and which are employed with respective traces on first and second circuit boards.

In the embodiment shown in FIG. 6 two conductive elastomeric bodies of the type shown in FIG. 3 are coupled or ganged together. The conductive inner layer 30*a* is sandwiched between insulative layers 36*a* and 38*a*. A conductive layer 40*a* and 42*a* are provided on the outer sides of layers 36*a* and 38*a*.

A second connector body is comprised of inner layer 30*b* sandwiched between insulative layers 36*b* and 38*b*. Conductive layer 42*a* also confronts the outer surface of layer 36*b*. And a conductive layer 42*b* is provided on the outer surface of layer 38*b*. Other numbers of elastomeric connectors can be similarly coupled or ganged together to suit intended interconnection requirements. The circuit boards associated with such a ganged version of the elastomeric connector will have signal and ground traces to selectively engage the respective conductive layers and ground layers of the ganged connector.

The invention is not to be limited by what has been particularly shown and described except as indicated in the appended claims.

What is claimed is:

1. An elastomeric connector for providing shielded electrical connection between contacts on planar surfaces comprising:

a multi-layer body of elastomeric material having top, bottom and side faces, and including an inner layer of conductive elastomeric material for providing electrical conduction between the first face and second face of the body;

first and second electrically insulative elastomeric layers on respective sides of the inner layer; and first and second electrically conductive elastomeric layers on the outer sides of the respective first and second electrically insulative layers;

the body being operative to engage first and second spaced planar surfaces each having signal and ground traces, with the inner layer in isolated electrical engagement with a plurality of corresponding signal traces of the spaced planar surfaces, and with the first and second conductive layers in electrical engagement with the ground traces of the spaced planar surfaces.

2. The connector of claim 1 wherein the inner layer is bonded to the first and second insulative layers, and wherein the first and second conductive layers are bonded to the respective first and second insulative layers.

3. The connector of claim 1 wherein the inner layer is composed of an array of elastomeric conductive elements each providing a conductive path between a first face and a second face thereof.

4. A connector system for providing shielded electrical connection between a pair of printed circuit boards, each of the circuit boards having an array of conductive signal traces and an interposed array of conductive ground traces and a contact area on each of the signal and ground traces, the connector system comprising:

a body of elastomeric material having top and bottom contact faces and side faces and a length sufficient to confront a plurality of the contact areas of the signal and ground traces of the circuit boards;

the body of elastomeric material including an inner layer of conductive elastic material for providing electrical conduction between the top face and bottom face of the body;

first and second electrically insulative elastomeric layers each bonded to a respective side face of the inner layer;

first and second electrically conductive elastomeric layers each bonded to a respective outer side of the electrically insulative layers; and a mounting assembly for disposing the body of elastomeric material in engagement with the pair of printed circuit boards and with the top and bottom faces of the inner layer of the body in electrical connection with the contact areas of the signal traces and the top and bottom edges of the electrically conductive elastomeric layers in electrical connection with the contact areas of the ground traces of the circuit boards.

5. The connector system of claim 4 wherein each of the printed circuit boards has a parallel array of conductive signal traces;

an interposed parallel array of conductive ground traces, with each signal trace being disposed between adjacent ground traces;

an elongated conductive path extending across the array of signal and ground traces and electrically joined to the ground traces.

6. The connector system of claim 5 including an insulating material provided over a portion of the signal traces which underlie the conductive elastomeric layers to prevent shorting of the signal traces by the conductive elastomeric layers.

7. The connector system of claim 4 wherein the mounting assembly includes a frame of rigid electrically insulating material having an opening sized to receive the body of elastomeric material with the conductive surfaces of the body exposed;

one or more alignment elements cooperative with the frame and the circuit boards to position the body of elastomeric material in registration with the signal and ground traces.

8. The connector of claim 1 wherein the multilayer body of elastomeric material is ganged with one or more like multilayer bodies to form a ganged elastomeric connector.

* * * * *